US007011704B2

(12) United States Patent
Altmannshofer

(10) Patent No.: US 7,011,704 B2
(45) Date of Patent: Mar. 14, 2006

(54) METHOD AND DEVICE FOR THE PRODUCTION OF A SINGLE CRYSTAL

(75) Inventor: Ludwig Altmannshofer, Massing (DE)

(73) Assignee: Wacker Siltronic Gesellschaft Fur Halbleitermaterialien AG, (DE)

( * ) Notice: Subject to any disclaimer, the term of this patent is extended or adjusted under 35 U.S.C. 154(b) by 68 days.

(21) Appl. No.: 10/209,106

(22) Filed: Jul. 31, 2002

(65) Prior Publication Data
US 2003/0024468 A1 Feb. 6, 2003

(30) Foreign Application Priority Data
Aug. 2, 2001 (DE) ............... 101 37 857

(51) Int. Cl.
*C30B 35/00* (2006.01)
*C30B 13/26* (2006.01)
(52) U.S. Cl. ..................... 117/37; 117/200
(58) Field of Classification Search ............ 117/13, 117/14, 15, 200, 206, 207, 208, 37
See application file for complete search history.

(56) References Cited

U.S. PATENT DOCUMENTS 4,851,628 A * 7/1989 Ammon et al. ............ 117/52
5,725,660 A 3/1998 Hiraishi

FOREIGN PATENT DOCUMENTS

DE 3007 377 9/1981
JP 2002249393 * 9/2002

OTHER PUBLICATIONS

Radial Oxygen Control Process in Silicon Crystals, IBM Technical Disclosure Bulletin, vol. 27(8), pp. 4817-4818, Jan. 1, 1985.*
English Derwent Abstract AN 1981-66242D corresponding to DE 3007377.
Patent Abstract of Japan corresponding to JP 07-315980.
Patent Abstract of Japan corresponding to JP 63-017291.

* cited by examiner

*Primary Examiner*—Duane Smith
*Assistant Examiner*—Matthew Anderson
(74) *Attorney, Agent, or Firm*—Brooks Kushman P.C.

(57) ABSTRACT

A method for the production of a single crystal has the single crystal crystallizing from a melt and being subjected to a rotation with an alternating rotation direction. The single crystal is periodically rotated through a sequence of rotation angles, and the rotation direction is changed after each rotation through a rotation angle of the sequence, with a change of the rotation direction defining an inversion point on the circumference of the single crystal. There is at least one recurring pattern of inversion points created, in which the inversion points lie distributed on straight lines that are aligned parallel with the z-axis and are spaced apart uniformly from one another.

8 Claims, 8 Drawing Sheets

METHOD AND DEVICE FOR THE PRODUCTION OF A SINGLE CRYSTAL

BACKGROUND OF THE INVENTION

1. Field of the Invention

The present invention relates to a method for the production of a single crystal, in which the single crystal crystallizing from a melt is subjected to a rotation with an alternating rotation direction. The present invention relates, in particular, to a method for the production of a single crystal by float-zone pulling without a crucible and by pulling the single crystal from a melt placed in a crucible.

2. The Prior Art

The pulling of single crystals made of semiconductor materials, for example silicon, germanium, gallium arsenide, gallium phosphide, or indium phosphide, is in most cases carried out by float-zone pulling without a crucible (floating zone crystal growth, FZ method) or by the method of pulling from a crucible (Czochralski method, CZ method).

In the FZ method, a polycrystalline stock rod is gradually melted with the aid of a radiofrequency coil. The molten material is converted into a single crystal by seeding with a monocrystalline seed crystal and by subsequent recrystallization. During the recrystallization, the diameter of the resulting single crystal is firstly conically enlarged (cone formation) until a desired final diameter is reached (rod formation). In the cone-formation phase, the single crystal is also mechanically supported, in order to relieve the load on the thin seed crystal. The basics of the FZ method are described, for example, in DE-3007377 A.

In the CZ method, a melt of the semiconductor material is prepared in a crucible, and a seed crystal is brought into contact with the melt surface and slowly lifted from the melt. A single crystal starts to grow on the bottom side of the seed crystal.

In both the CZ and FZ methods, it is customary to rotate the single crystal in a controlled way as a function of time, in order to achieve a maximally uniform and unimpaired crystal growth.

In conjunction with the FZ method, JP-2820027 has also described that the single crystal is rotated about its axis, in one sense or with an alternating rotation direction, during the FZ pulling. This alternating rotation is intended to cause effective mixing of the melt and therefore a homogeneous distribution of dopants.

Despite years of experience, there is a difficulty in achieving shape-stable growth of the single crystal, especially with respect to the production of single crystals with diameters of 100 mm or more. The single crystal is intended, as far as possible, to grow cylindrically. If the growth front erupts in the radial direction, a single crystal results which is deformed by bulges and is difficult or impossible to process into wafers. It is furthermore desirable, but not straightforward to achieve, for the resulting growth edges to be as narrow as possible and uniform on the circumference of the single crystal.

SUMMARY OF THE INVENTION

It is therefore an object of the present invention to provide a method which prevents the eruption of single crystals and creates a cylindrical appearance of the single crystal.

The above object is achieved according to the present invention by providing a method for the production of a single crystal, in which the single crystal crystallizing from a melt is subjected to a rotation with an alternating rotation direction, wherein the single crystal is periodically rotated through a sequence of rotation angles, and the rotation direction is changed after each rotation through a rotation angle of the sequence, with a change of the rotation direction defining an inversion point on the circumference of the single crystal, and with at least one recurring pattern of inversion points resulting, in which the inversion points lie distributed on straight lines that are aligned parallel with the z-axis and are spaced apart uniformly from one another.

The present invention ensures both the desired cylindrical growth and the creation of narrow growth edges. It can be applied to the FZ method as well as to the CZ method, and it is preferably used for the processing of semiconductor material, in particular silicon. In the FZ method, it is straightforward to implement because the single crystal is in any case already supported during the cone formation. In the FZ method, the torsionally stiff support can be used to transmit the alternating rotation. In the CZ method, a corresponding support must be attached to the starting cone of the single crystal. Torsionally stiff supports that are normally used to relieve the load on the thin neck of heavy single crystals are suitable. Also suitable are devices that are fitted to a so-called bicone.

BRIEF DESCRIPTION OF THE DRAWINGS

Other objects and features of the present invention will become apparent from the following detailed description considered in connection with the accompanying drawings which disclose several embodiments of the present invention. It should be understood, however, that the drawings are designed for the purpose of illustration only and not as a definition of the limits of the invention.

In the drawings, wherein similar reference characters denote similar elements throughout the several views.

DETAILED DESCRIPTION OF THE PREFERRED EMBODIMENTS

Figure 1:
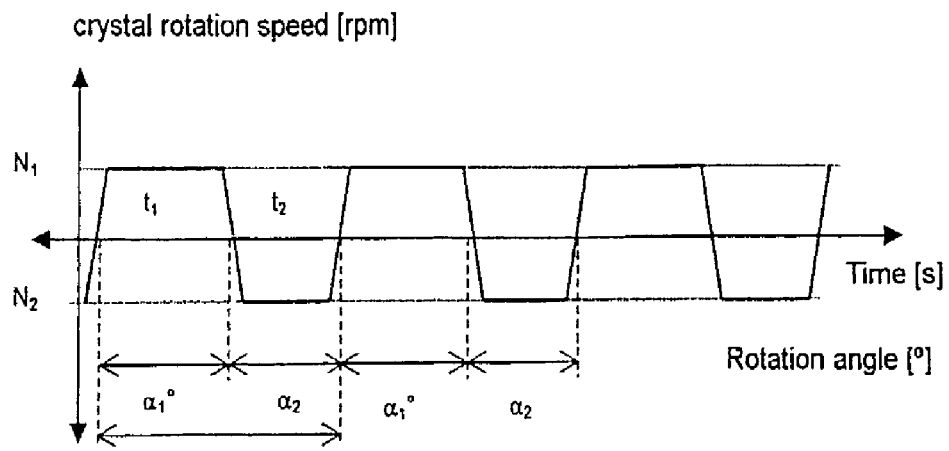
FIGS. 1 and 2 show sequences of rotation angles.
Figure 2:
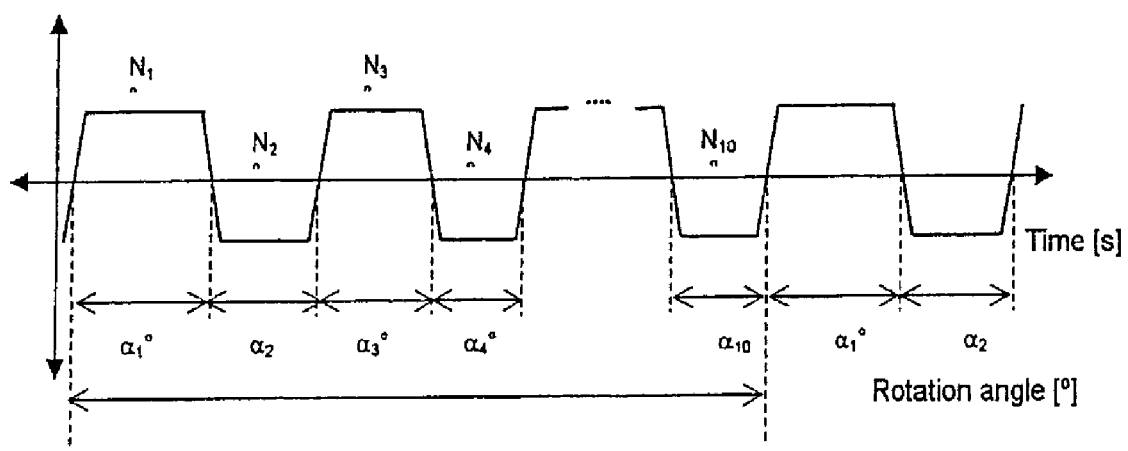

Achieving the object of the invention requires a special kind of alternating rotation. According to the present invention, the single crystal is rotated through a sequence of rotation angles, with the rotation direction changing after each rotation of the sequence. After the single crystal has been rotated through the last rotation angle of the sequence, a new period is started by rotating the single crystal again through the first rotation angle of the sequence. A sequence of rotation angles preferably comprises from 2 to 10 rotation angles. FIG. 1 represents the time profile for a sequence of 2 rotation angles $\alpha_1$ and $\alpha_2$. For simplicity, such a sequence will be referred to as a 2-angle scheme. Correspondingly, the sequence represented in FIG. 2 involves a 10-angle scheme with the rotation angles $\alpha_1$ to $\alpha_{10}$. In the example shown in FIG. 1, the single crystal is firstly rotated through the angle $\alpha_1$ in the clockwise direction with a rotational speed N1. This is followed by a change of the rotation direction and a counterclockwise rotation through the angle $\alpha_2$ with a rotational speed N2, and periodically recurring rotations through $\alpha_1$ and $\alpha_2$. The time at which a change of the rotation direction takes place is referred to as an inversion point. In the course of the growth of the single crystal, a multiplicity of inversion points are executed.

According to the present invention, the selection of the rotation angles must not take place randomly, but rather in such a way that the inversion points form at least one recurring pattern. This recurring pattern is distributed homogeneously over the circumference of the single crystal, with the inversion points lying on straight lines that are parallel with the z-axis. This requirement can be best illustrated with the aid of a polar coordinate representation as in FIG. 3. In the selected representation, the radius of the coordinate system corresponds to a time axis that represents the duration of the crystal growth. Instead of this, however, the duration of the crystal growth may also be indicated as a crystal length in the direction of the z-axis. The angles of the coordinate system refer to positions on the circumference of the single crystal.

Inversion points are marked with the letters R and L in the representation, with R denoting a change of the rotation direction to a clockwise rotation and L denoting a change of the rotation direction to a counterclockwise rotation. With the selected rotational speeds, the inversion points form a roselike pattern after 360 seconds. This pattern is created, for example, with a rotation which is based on a 2-angle scheme with rotation angles of $\alpha_1=400°$ and $\alpha_2=260°$ and rotational speeds of $N_R=20$ rpm and $N_L=-20$ rpm. The inversion points are distributed on straight lines that are aligned in the z-direction at equal spacings of 20° on the circumference of the single crystal.

Figure 4:
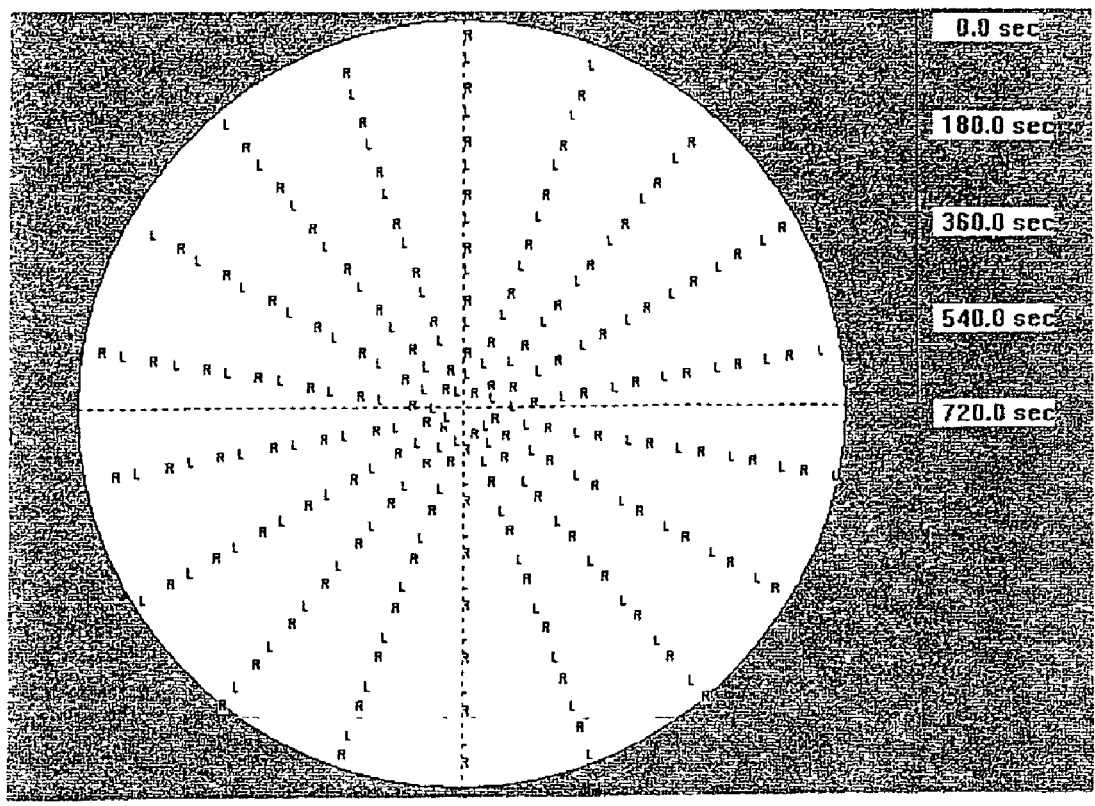
Figure 5:
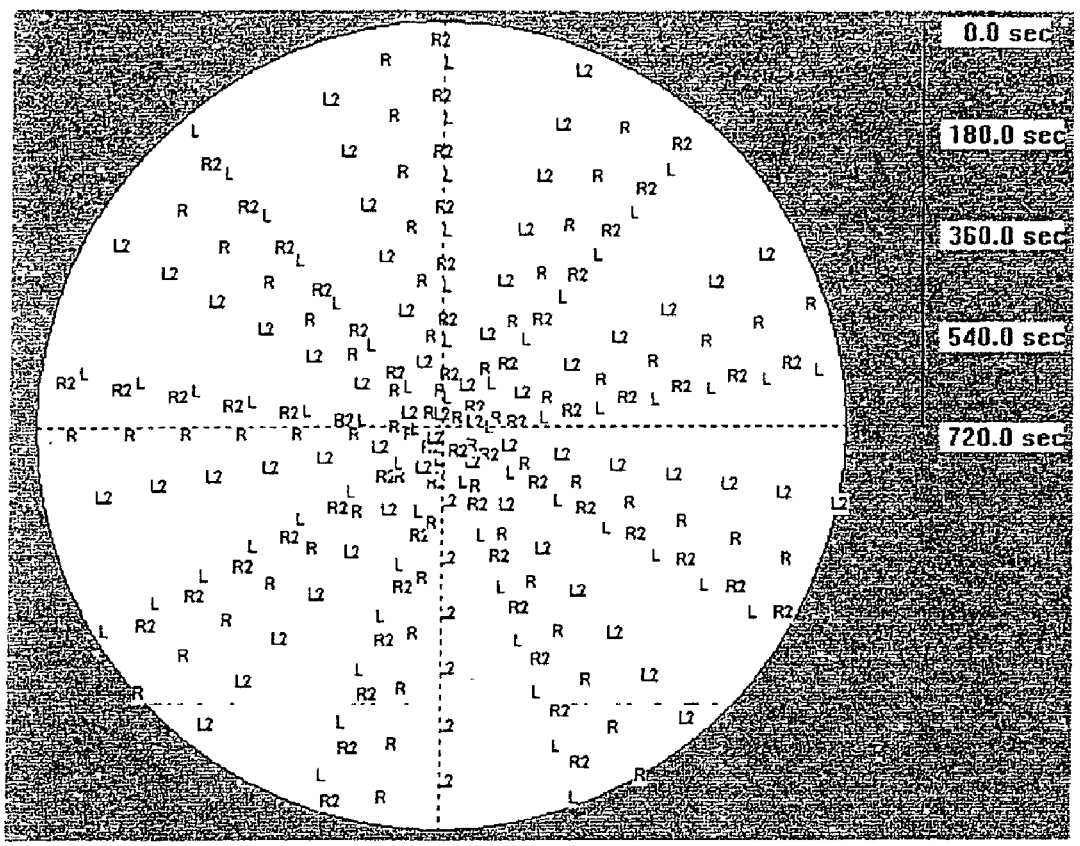

FIG. 4 shows the situation after 720 seconds. It can be seen that the pattern recurs at the correct angles. The first complete pattern, which recurs periodically and at the correct angles, is referred to as a basic pattern (spectral frequency). A plurality of patterns may be superimposed, for example the patterns in FIG. 5 which are formed by the inversion points R, L, R2 and L2 of a 4-angle scheme. The straight lines of a pattern have equal spacings from one another, so that the inversion points of a pattern lie distributed uniformly over the circumference of the single crystal.

It has been found to be particularly advantageous for inversion points to lie on at least 4, preferably from 8 to 48 straight lines. It is also particularly preferable for the number of straight lines to be a multiple of the number of growth edges. The number of growth edges is dictated by the symmetry of the crystal structure.

Figure 3:
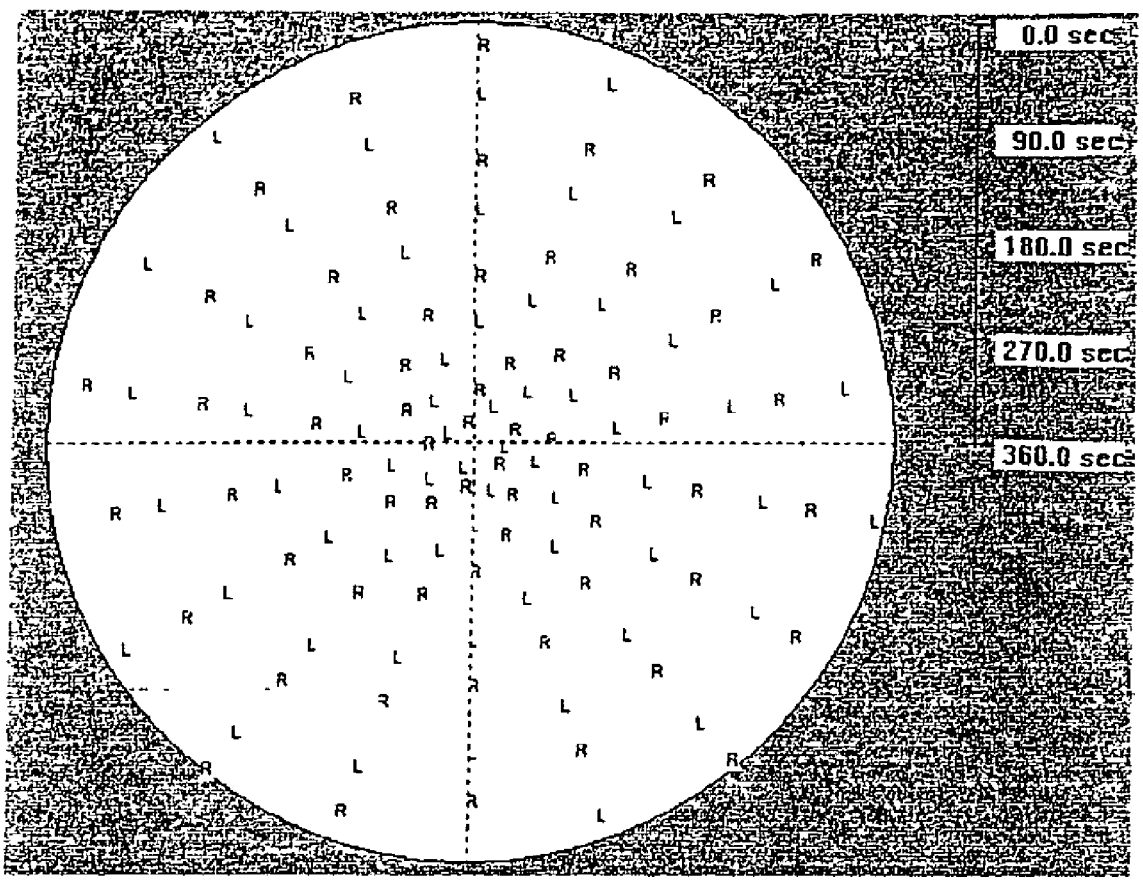
FIGS. 3, 4 and 5 show, in a polar coordinate illustration, patterns of inversion points according to the present invention.
Figure 6:
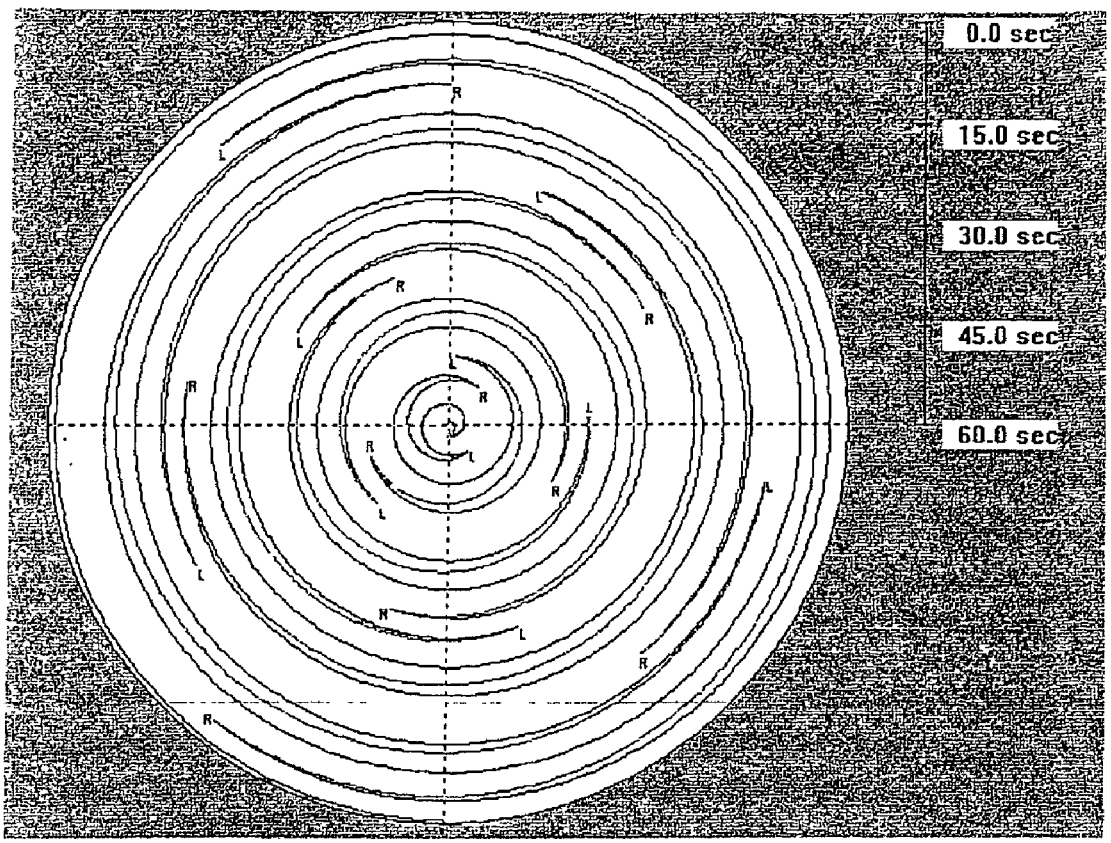
FIG. 6 shows, in a track representation, inversion points which are preferred in terms of the time at which they appear and their position.
Figure 7:
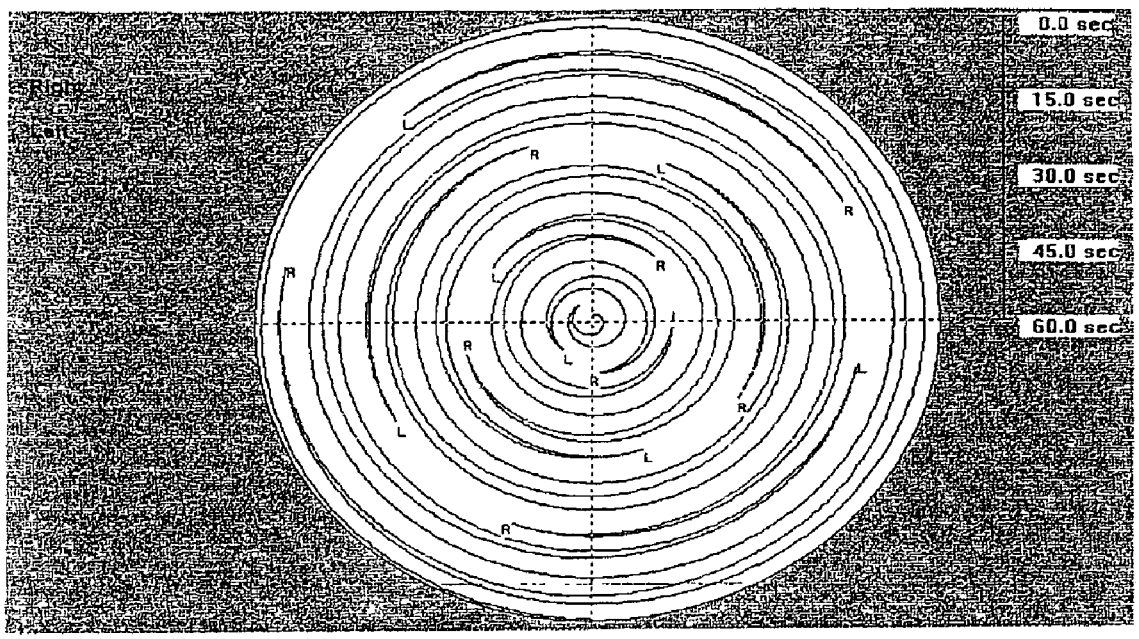
FIG. 7 represents a counterexample for FIG. 6.

FIG. 6 corresponds to the representation in FIG. 3, with the difference that the inversion points are represented as being joined by tracks and the radius covers a period of only 60 seconds. This track representation shows a so-called overlapping operation, which is preferred because it favors the formation of narrow growth edges and counteracts dislocation. During the overlapping operation, after a change of the rotation direction, a rotation is carried out through a rotation angle which is equal to $n*360°+\Delta$, where n is an integer number, preferably 1 or 2, and $\Delta$ can assume a positive value up to 90°. In the track representation, this is demonstrated by the fact that the tracks of chronologically successive inversion points, observed in a segment with a size of 90°, overlap. In contrast to this, reference is made to FIG. 7, which represents a non-overlapping operation that contains gaps.

In order to achieve maximally cylindrical crystal growth, it is furthermore preferable to select the sequence of rotation angles in such a way that when the basic pattern is formed, the inversion points are already distributed as uniformly as possible over the circumference of the single crystal. This is the case, in particular, when chronologically successive pairs of inversion points are mutually offset, as shown in FIG. 6.

Figure 8:
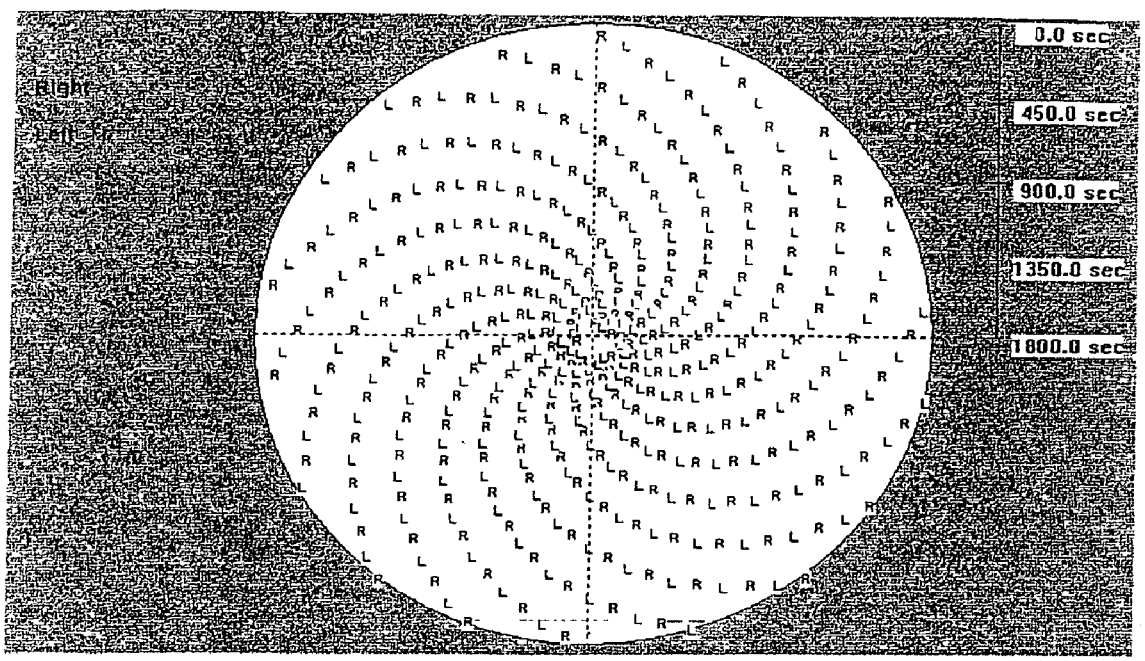
FIG. 8 is a counterexample for the representations in FIGS. 3, 4 and 5.

Once the sequence of rotation angles has been set, the rotation of the single crystal should be controlled as accurately as possible, so as to create the desired cylindrical growth of the single crystal. The angular errors made when controlling the rotational movement with an alternating rotation direction should not exceed an angular error of +/−1° in total. If the predetermined angular positions of the inversion points are not complied with, the effect of this can be that the rotational movements cause the single crystal to grow in such a way that the structure of a long-period screw thread is created on its surface. Such a structure may be deliberately induced by using an angle scheme in which the inversion points lie on helical lines. FIG. 8 shows a corresponding representation in the polar coordinate diagram.

Figure 9:
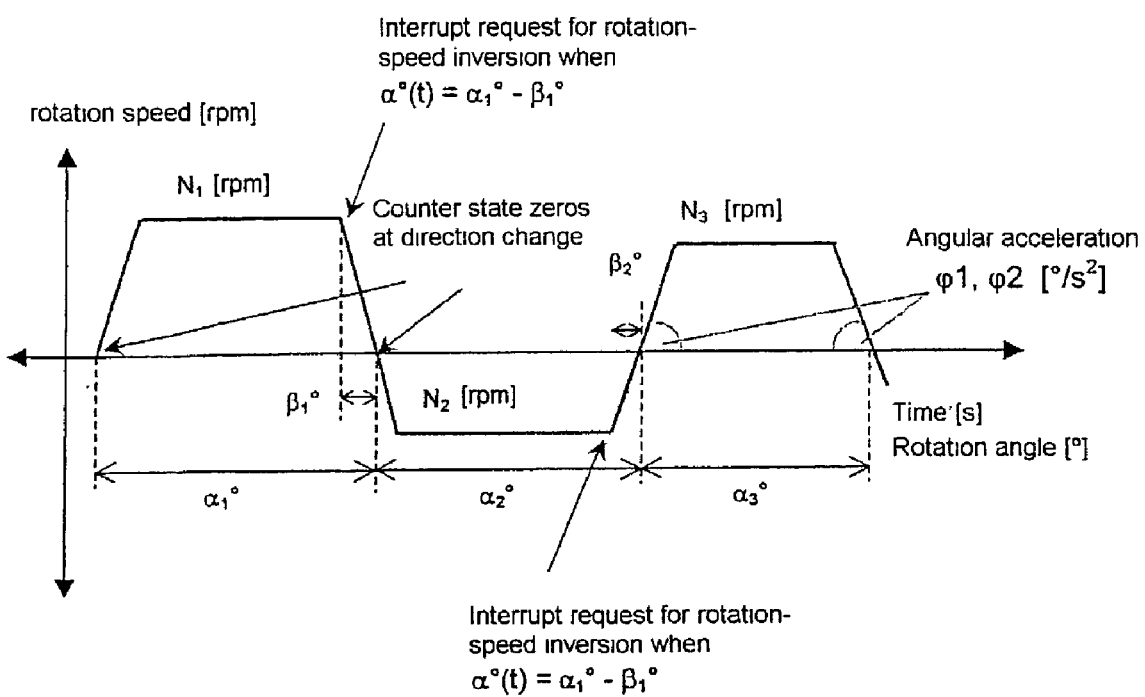
FIG. 9 is a representation of the technical implementation of the invention.

With respect to the technical implementation of the invention, a device is provided for rotating a single crystal, having a position sensor with a resolution of at least 10000 pulses/revolution, which is coupled to a pulling shaft and to a counter module that respectively counts pulses forward or backward depending on the rotation direction. The normalized counter state contains the instantaneous position. The change of the rotation direction preferably takes place with a constant angular acceleration (FIG. 9). The rotational speed levels $N_{1...10}$ and the angular acceleration $\phi1, \phi2$ give the delay angles $\beta_{1...10}°$. The rotation angles $\alpha_{1...10}$ and the known delay angles $\beta_{1...10}$ give the rigidly defined time at which the interrupt for the rotation-speed inversion needs to be activated by the counter module. This is in order to achieve the predetermined rotation angles $\alpha_{1...10}$ when the rotational speed passes through zero. So that the desired basic pattern is produced and the crystal does not erupt, the angular error $\delta°$ in the relevant time period should be kept below +/−1°. This is achieved with an angle control loop which modifies the interrupt request point for a given angle scheme according to the following criteria:

$$IR\alpha_1°{}_{new}(t)=IR\alpha_1°{}_{old}(t)+\delta\alpha_1°{}_{old}*Kp_\alpha$$

$$IR\alpha_2°{}_{new}(t)=IR\alpha_2°{}_{old}(t)+\delta\alpha_2°{}_{old}*Kp_\alpha$$

. . .

$$IR\alpha_{10}°{}_{new}(t)=IR\alpha_{10}°{}_{old}(t)+\delta\alpha_{10}°{}_{old}*Kp_\alpha$$

with ($\rightarrow 0.1<Kp<0.3$)

Accordingly, while only a few embodiments of the present invention have been shown and described, it is obvious that many changes and modifications may be made thereunto without departing from the spirit and scope of the invention.

What is claimed is:

1. A method for the production of a single crystal, comprising
    rotating a single crystal crystallizing from a melt, said rotating being with an alternating rotation direction, wherein the single crystal has a circumference and is periodically rotated through a sequence of rotation angles;
    changing a rotation direction after each rotation through a rotation angle of the sequence, with a change of the rotation direction defining an inversion point on the circumference of the single crystal; and creating at least one recurring pattern of inversion points, in which the inversion points lie distributed on 4 to 48 straight lines that are aligned parallel with a z-axis and are spaced apart uniformly from one another.

2. The method as claimed in claim 1, wherein the number of straight lines is a multiple of the number of growth edges.

3. The method as claimed in claim 1, wherein the sequence of rotation angles comprises from 2 to 10 different angles.

4. The method as claimed in claim 1, wherein the single crystal is rotated in an overlapping operation, with a rotation being carried out, after a change of the rotation direction, through a rotation angle which is equal to $n*360°+\Delta$, and n is an integer number and $\Delta$ can assume a positive value up to 90°.

5. The method as claimed in claim 1, comprising forming the at least one recurring pattern of inversion points be pairs of inversion points in a specific time, with chronologically successive pairs being mutually offset when the inversion points are observed in a polar coordinate representation, in which the radius of the representation describes the time axis and the angle of the representation describes the position of the inversion points on the circumference of the single crystal.

6. The method as claimed in claim 1, comprising periodically rotating the single crystal through the sequence of rotation angles with a precision which does not exceed an angular error of +/−1° in total.

7. The method as claimed in claim 1, comprising supporting the single crystal by a support and rotating the single crystal with the aid of the support.

8. A device for rotating a single crystal, comprising means for rotating a single crystal in a forward and backward rotation direction;

a position sensor with a resolution of at least 10000 pulses/revolution; and said position sensor is coupled to a pulling shaft for pulling the single crystal and is coupled to a counter module that respectively counts pulses forward or backward depending on the rotation direction.

* * * * *